United States Patent
Ott et al.

(10) Patent No.: US 8,399,317 B2
(45) Date of Patent: Mar. 19, 2013

(54) TRANSISTOR HAVING AN ETCH STOP LAYER INCLUDING A METAL COMPOUND THAT IS SELECTIVELY FORMED OVER A METAL GATE, AND METHOD THEREFOR

(75) Inventors: Andrew Ott, Grayslake, IL (US); Sean King, Beaverton, OR (US); Ajay Sharma, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/273,771

(22) Filed: Oct. 14, 2011

(65) Prior Publication Data

US 2012/0034773 A1 Feb. 9, 2012

Related U.S. Application Data

(62) Division of application No. 11/646,764, filed on Dec. 27, 2006, now Pat. No. 8,120,114.

(51) Int. Cl.
*H01L 21/336* (2006.01)
*H01L 21/4763* (2006.01)
*H01L 21/44* (2006.01)

(52) U.S. Cl. ........ 438/197; 438/637; 438/687; 438/688; 257/E21.158; 257/E21.159; 257/E21.202

(58) Field of Classification Search .................. 438/197, 438/637, 687, 688; 257/364, 388, 412, 734, 257/E29.158, E29.159, E21.202
See application file for complete search history.

(56) References Cited

U.S. PATENT DOCUMENTS

| | | | |
|---|---|---|---|
| 4,686,000 A | 8/1987 | Heath | |
| 5,512,131 A | 4/1996 | Kumar et al. | |
| 6,020,024 A | 2/2000 | Maiti et al. | |
| 6,083,836 A | 7/2000 | Rodder | |
| 6,114,099 A | 9/2000 | Liu et al. | |
| 6,121,663 A | 9/2000 | En et al. | |
| 6,297,169 B1 | 10/2001 | Mangat et al. | |
| 6,413,587 B1 | 7/2002 | Hawker et al. | |
| 6,518,168 B1 | 2/2003 | Clem et al. | |
| 6,559,474 B1 | 5/2003 | Craighead et al. | |
| 6,638,874 B2 | 10/2003 | Yi et al. | |
| 6,677,238 B2 | 1/2004 | Seki | |
| 6,893,966 B2 | 5/2005 | Delamarche et al. | |
| 7,067,306 B2 | 6/2006 | Singhvi et al. | |
| 7,199,051 B2 | 4/2007 | Lee et al. | |
| 7,244,669 B2 | 7/2007 | Sirringhaus et al. | |
| 7,329,592 B2 | 2/2008 | Myerson et al. | |
| 7,390,739 B2 | 6/2008 | Lazovsky et al. | |
| 2002/0140103 A1 | 10/2002 | Kloster et al. | |
| 2003/0064580 A1 | 4/2003 | Ott et al. | |
| 2003/0082858 A1 | 5/2003 | Morii et al. | |
| 2003/0137050 A1 | 7/2003 | Chambers et al. | |
| 2003/0143823 A1 | 7/2003 | Ott et al. | |
| 2003/0173651 A1 | 9/2003 | Wong et al. | |
| 2003/0186535 A1 | 10/2003 | Wong et al. | |
| 2003/0230170 A1 | 12/2003 | Woodfield et al. | |

(Continued)

OTHER PUBLICATIONS

"Final Office Action", U.S. Appl. No. 11/646,764 mailed Oct. 2, 2008, 1-12.

(Continued)

*Primary Examiner* — Kevin Parendo
(74) *Attorney, Agent, or Firm* — Blakely, Sokoloff, Taylor & Zafman LLP

(57) ABSTRACT

In one aspect, an apparatus may include a metal gate of a transistor. An etch stop layer may be selectively formed over the metal gate. The etch stop layer may include a metal compound. An insulating layer may be over the etch stop layer. A conductive structure may be included through the insulating layer to the metal gate. Methods of making such transistors are also disclosed.

12 Claims, 8 Drawing Sheets

U.S. PATENT DOCUMENTS

| | | |
|---|---|---|
| 2003/0231974 A1 | 12/2003 | Woodfield et al. |
| 2004/0016319 A1 | 1/2004 | Woodfield et al. |
| 2004/0072093 A1 | 4/2004 | Itami |
| 2004/0101667 A1 | 5/2004 | O'Loughlin et al. |
| 2004/0118245 A1 | 6/2004 | Ott et al. |
| 2004/0118246 A1 | 6/2004 | Woodfield et al. |
| 2004/0118247 A1 | 6/2004 | Woodfield et al. |
| 2004/0119163 A1 | 6/2004 | Wong et al. |
| 2004/0120841 A1 | 6/2004 | Ott et al. |
| 2004/0132314 A1 | 7/2004 | Decre et al. |
| 2004/0141869 A1 | 7/2004 | Ott et al. |
| 2004/0146640 A1 | 7/2004 | Ott et al. |
| 2004/0159185 A1 | 8/2004 | Shamblen et al. |
| 2004/0165815 A1 | 8/2004 | Kitagawa |
| 2004/0170760 A1 | 9/2004 | Meagley et al. |
| 2004/0185679 A1 | 9/2004 | Ott et al. |
| 2004/0208773 A1 | 10/2004 | Woodfield et al. |
| 2004/0211293 A1 | 10/2004 | Shamblen et al. |
| 2004/0253136 A1 | 12/2004 | Shamblen et al. |
| 2004/0263739 A1 | 12/2004 | Sirringhaus et al. |
| 2005/0050997 A1 | 3/2005 | Shamblen et al. |
| 2005/0055494 A1 | 3/2005 | Doris et al. |
| 2005/0087517 A1 | 4/2005 | Ott et al. |
| 2005/0145070 A1 | 7/2005 | Woodfield et al. |
| 2005/0189599 A1 | 9/2005 | Lu |
| 2005/0208753 A1 | 9/2005 | Ott et al. |
| 2005/0217426 A1 | 10/2005 | Shamblen et al. |
| 2005/0220656 A1 | 10/2005 | Shamblen et al. |
| 2005/0223849 A1 | 10/2005 | Ott et al. |
| 2005/0258468 A1 | 11/2005 | Colombo et al. |
| 2006/0003597 A1 | 1/2006 | Golonzka et al. |
| 2006/0018781 A1 | 1/2006 | Woodfield et al. |
| 2006/0038296 A1 | 2/2006 | King et al. |
| 2006/0057017 A1 | 3/2006 | Woodfield et al. |
| 2006/0102255 A1 | 5/2006 | Woodfield et al. |
| 2006/0102955 A1 | 5/2006 | Chen et al. |
| 2006/0128142 A1 | 6/2006 | Whelan et al. |
| 2006/0167725 A1 | 7/2006 | Grunspan et al. |
| 2006/0246740 A1 | 11/2006 | Cartier et al. |
| 2006/0267106 A1 | 11/2006 | Chao et al. |
| 2006/0275167 A1 | 12/2006 | Ott et al. |
| 2007/0032675 A1 | 2/2007 | Meagley et al. |
| 2007/0044870 A1 | 3/2007 | Woodfield et al. |
| 2007/0059888 A1 | 3/2007 | Sukekawa |
| 2007/0105136 A1 | 5/2007 | Staudt et al. |
| 2007/0152343 A1 | 7/2007 | Richter et al. |
| 2007/0173008 A1 | 7/2007 | Chudzik et al. |
| 2007/0257249 A1 | 11/2007 | Mocuta et al. |
| 2008/0001237 A1 | 1/2008 | Chang et al. |
| 2008/0116481 A1 | 5/2008 | Sharma et al. |

OTHER PUBLICATIONS

Gladfelter, Wayne L., "Selective Metallization by Chemical Vapor Disposition", *American Chemical Society*, 0897-4756/93/2805-1372, (1993), pp. 1372-1388.

Lane, M.W., et al, "Relationship Between Interfacial Adhesion and Electromigration in CU Metallization," Journal of Applied Physics, vol. 93. No. 3, Feb. 1, 2003. pp. 1417-1421.

Seo, Eun K., et al., "Atomic Layer Deposition of Titanium Oxide on Self-Assembled-Monolayer-Coated Gold", *Chem. Mater.*, vol. 16, No. 10, Department of Chemistry, Kookmin University, Chongnung-dong, Songbuk-ku, Seoul 136-702, Korea, (Apr. 15, 2004), pp. 1878-1883.

FIG. 4

SELECTIVELY FORMING ETCH STOP LAYER OVER METAL GATE OF TRANSISTOR
454

SELECTIVELY DEPOSIT METAL LAYER OVER METAL GATE OF TRANSISTOR — 456

FORM ETCH STOP LAYER OVER METAL GATE BY REACTIVELY CONVERTING METAL OF METAL LAYER TO METAL COMPOUND — 458

TRANSISTOR HAVING AN ETCH STOP LAYER INCLUDING A METAL COMPOUND THAT IS SELECTIVELY FORMED OVER A METAL GATE, AND METHOD THEREFOR

The present application is a divisional of U.S. patent application Ser. No. 11/646,764, filed Dec. 27, 2006, entitled "TRANSISTOR HAVING AN ETCH STOP LAYER INCLUDING A METAL COMPOUND THAT IS SELECTIVELY FORMED OVER A METAL GATE, AND METHOD THEREFOR", now U.S. Pat. No. 8,120,114. Application Ser. No. 11/646,764 is hereby incorporated by reference.

BACKGROUND

1. Field

Embodiments of the invention relate to microelectronic devices and their manufacture. In particular, embodiments of the invention relate to microelectronic devices that include etch stop layers selectively formed over a metal gate where the etch stop layers include metal compounds, and to methods of manufacturing such microelectronic devices.

2. Background Information

The size of transistors and the spacing between transistors continues to decrease in an effort to increase device integration density in integrated circuits that are spaced more closely together. As the size of the transistors and the spacing between them decrease, the risk of electrical contact shortings increases.

Electrical contacts are typically created to provide electrical connections to the sources, drains, and gates of the transistors. Typically, lithography techniques are used to define the location of the contact holes for the electrical contacts. Then the contact holes are then filled with a conductive material to form electrical contacts to source, drain, and gate regions of the transistor.

Misalignment or misregistration of the contact holes may potentially occur due in part to resolution limitations of the patterning and lithography tools, imperfections of the wafer processing operations, or combinations of these factors. If misalignment or misregistration occurs, in some cases, the contact hole of a source or drain contact may potentially erroneously be created above the gate of the transistor so that the conductive material may electrically couple with the gate. Such electrical coupling may represent contact-to-gate shorting, which may render the transistor inoperable and tend to reduce wafer yields.

One known way to help reduce the risk of such shorting is to reduce the size of the contact holes. However, this may lead to an increase in contact resistance.

Another know way to reduce the risk of such shorting is to increase the spacing between the source, drain, and gate of the transistor so that fewer misalignments are observed for a given registration capability. However, this approach tends to decrease the number of transistors that can be fabricated on a die or make the die bigger.

BRIEF DESCRIPTION OF THE SEVERAL VIEWS OF THE DRAWINGS

The invention may best be understood by referring to the following description and accompanying drawings that are used to illustrate embodiments of the invention. In the drawings:

FIG. 4 is a method of selectively forming an etch stop layer over a metal gate of a transistor, according to one or more embodiments of the invention.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
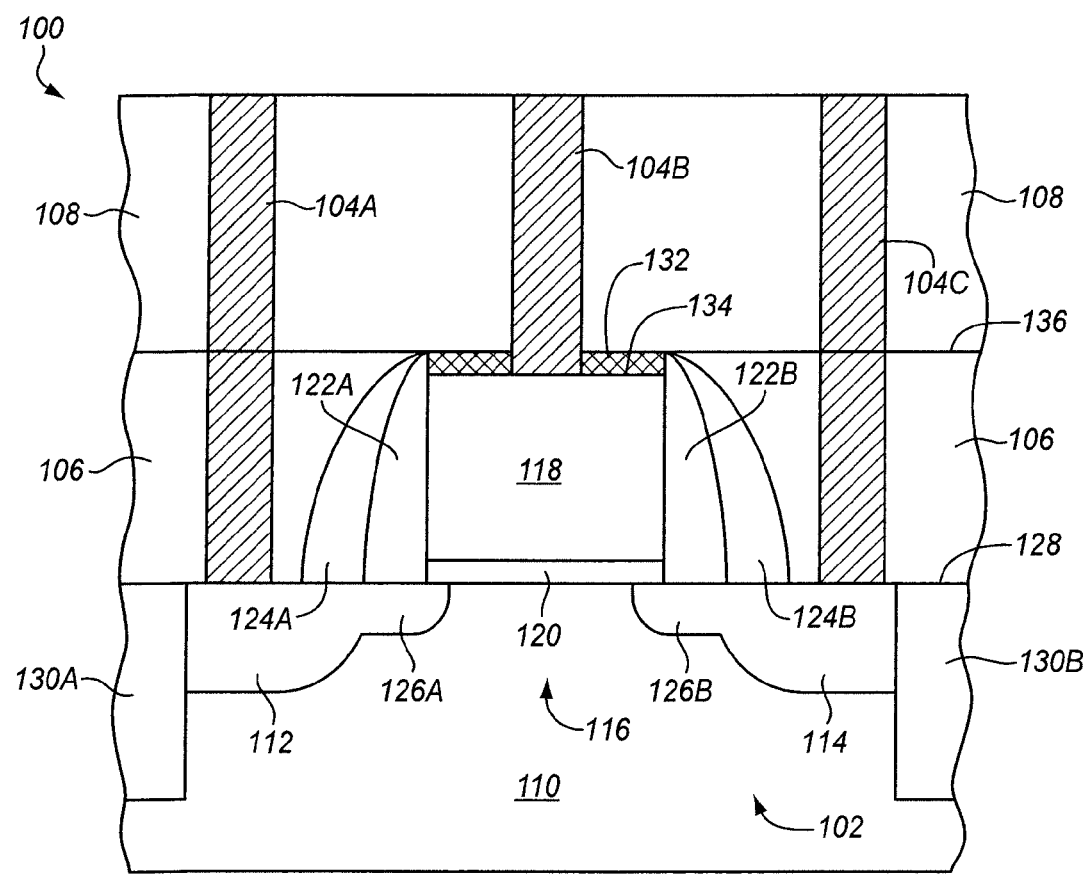
FIG. 1 is a cross-sectional side view of a microelectronic device, according to one or more embodiments of the invention.

FIG. 1 is a cross-sectional side view of a microelectronic device 100, according to one or more embodiments of the invention. The microelectronic device includes a transistor 102 and electrical contacts 104A, 104B, 104C through insulating layers 106, 108 to the transistor.

The transistor represents one example of a suitable transistor. The transistor includes a source region 112 of a substrate 110, a drain region 114 of the substrate, and a channel region 116 of the substrate defined between the source and drain regions. The transistor also includes a metal gate 118 over the channel region, and a gate insulator or dielectric 120 disposed between and separating the metal gate from the channel region. The metal gate, source region, and drain region are each terminals of a three-terminal insulated gate field effect transistor (FET). Occasionally the terminals are referred to as junctions or electrodes.

The transistor also includes first 122A and second 122B sidewall spacers, and first 124A and second 124B sidewall etch stops. The first and second sidewall spacers abut the sidewalls of the metal gate above the source and drain regions of the substrate, respectively. The first and second sidewall etch stops abut the respective first and sidewall spacers. The first and second sidewall spacers are separated from the metal gate by the intervening first and second sidewall spacers.

The transistor also includes source tip or extension 126A and drain tip or extension 126B regions of the substrate. The source and drain tip regions are shallower than the source and drain, respectively, and represent portions of the source and drain, respectively, which are closest to the metal gate. The channel region of the substrate is disposed between the tip or extension regions.

The microelectronic device also includes first 106 and second 108 insulating layers formed over an upper surface 128 of the substrate. Three metal or otherwise conductive electrical contact structures are formed through the insulating layers to provide electrical connection to the transistor. In particular, a first conductive electrical contact structure 104A is formed through the first and second insulating layers to provide electrical connection to the source region of the transistor. Likewise, a second conductive electrical contact structure 104B is formed through the first and second insulating layers to provide electrical connection to the drain region of the transistor. A third conductive electrical contact structure 104C is formed through the second insulating layer to provide electrical connection to the metal gate of the transistor.

The microelectronic device includes first 130A and second 130B field isolation regions of the substrate. The first and second field isolation regions may include shallow trench isolation (STI), and help to electrically isolate or at least insulate the transistor. The source and drain regions are disposed between the field isolation regions.

Referring again to FIG. 1, the transistor includes an etch stop layer 132, in accordance with one or more embodiments of the invention. The etch stop layer is selectively formed over, and in this particular case directly on, a top surface 134 of the metal gate. That is, the etch stop layer is self-aligned over the metal gate. As shown in the illustrated embodiment, the etch stop layer may be disposed between the first and second sidewall spacers. Depending upon how the etch stop layer is formed, the etch stop layer may slightly laterally encroach upon the sidewall spacers and potentially upon the top surface 136 of the first insulating layer nearest the metal gate, although this amount is typically quite small (for example less than about 20 nm). Accordingly, the etch stop layer is not formed, or at least not substantially formed, over the top surface of the first insulating layer. The term "not substantially formed over the top surface of the first insulating layer" is intended to encompass the aforementioned slight encroachment, which is typically limited to a distance of about 30 nm or less from the edge of the metal gate.

In one or more embodiments of the invention, the etch stop layer may include a metal compound. In one or more embodiments of the invention, the metal compound may be dielectric or insulating. In one or more embodiments of the invention, the etch stop layer may include a compound of a metal and one or more of oxygen, nitrogen, carbon, and boron. Examples of suitable metal compounds include, but are not limited to, oxides of a metal, nitrides of a metal, carbides of a metal, borides of a metal, and combinations thereof. Examples of suitable combinations include oxide-nitrides of a metal, oxide-carbides of a metal, oxide-nitride-carbides of a metal, nitride-carbides of a metal (e.g., carbon nitrides), and nitride-borides of a metal (e.g., boron nitride).

In one or more embodiments of the invention, selectively forming the etch stop layer including the metal compound over the metal gate of the transistor may include forming the metal compound by reactively converting a metal of a top surface of the metal gate. As previously discussed, the reactive conversion may include oxidation (e.g., reacting or combining the metal with oxygen or an oxygen containing compound to form an oxide of the metal), reacting or combining the metal with nitrogen or a nitrogen containing compound to form an nitride of the metal, reacting or combining the metal with carbon or a carbon containing compound to form an carbide of the metal, reacting or combining the metal with boron or a boron containing compound to form an boride of the metal, or a combination thereof.

In one or more embodiments of the invention, a native metal of the top surface of the metal gate may be reactively converted to form the metal compound. This approach will be shown and described further below in conjunction with FIG. 3B. In such a case, the metal of the metal compound of the etch stop layer may be the same as the metal of the top surface of the metal gate immediately below the etch stop layer at the interface. For example, both metals may be the same metal selected from aluminum, chromium, molybdenum, nickel, titanium, tungsten, tantalum, or an alloy or other combination thereof. As used herein, the term metal may be used to refer to either a pure of individual metal or an alloy, mixture, stack, or other combination of two or more metals with potentially other non-metal ingredients included as long as the combination generally has the characteristics of a metal.

As another option, in one or more embodiments of the invention, a metal layer cap may be selectively deposited over the native metal of the top surface of the metal gate, and then the etch stop layer may be formed over the metal gate by reactively converting at least a portion of the deposited metal layer cap to a metal compound. This approach will be shown and described further below in conjunction with FIGS. 4 and 5A-B. In such a case, the metal of the metal compound of the etch stop layer may be different than the native metal of the top surface of the metal gate upon which the metal layer is deposited. Advantageously, such use of a metal cap may allow each metal to be selected independently of the other in order to achieve good performance in meeting the respective design functions. As one example, the metal of the metal compound of the etch stop layer may be better capable of forming a passivating oxide, a passivating nitride, a passivating carbide, or a combination thereof, than the native metal of the metal gate. As another example, the metal of the metal compound of the etch stop layer may be better capable of forming an oxide, nitride, carbide, or combination thereof, at least under the formation conditions, than the native metal of the metal gate. Other criteria for selecting the different metals are also contemplated.

Yet another option is to deposit an etch stop layer directly, rather than reactively converting the top of the metal gate or a metal cap layer. For example, in various embodiments of the invention, an oxide of a metal, a nitride of a metal, a carbide of a metal, a boride of a metal, or a combination thereof may be selectively deposited over the gate, such as, for example, by chemical vapor deposition (CVD) or atomic layer deposition (ALD).

Figure 2:
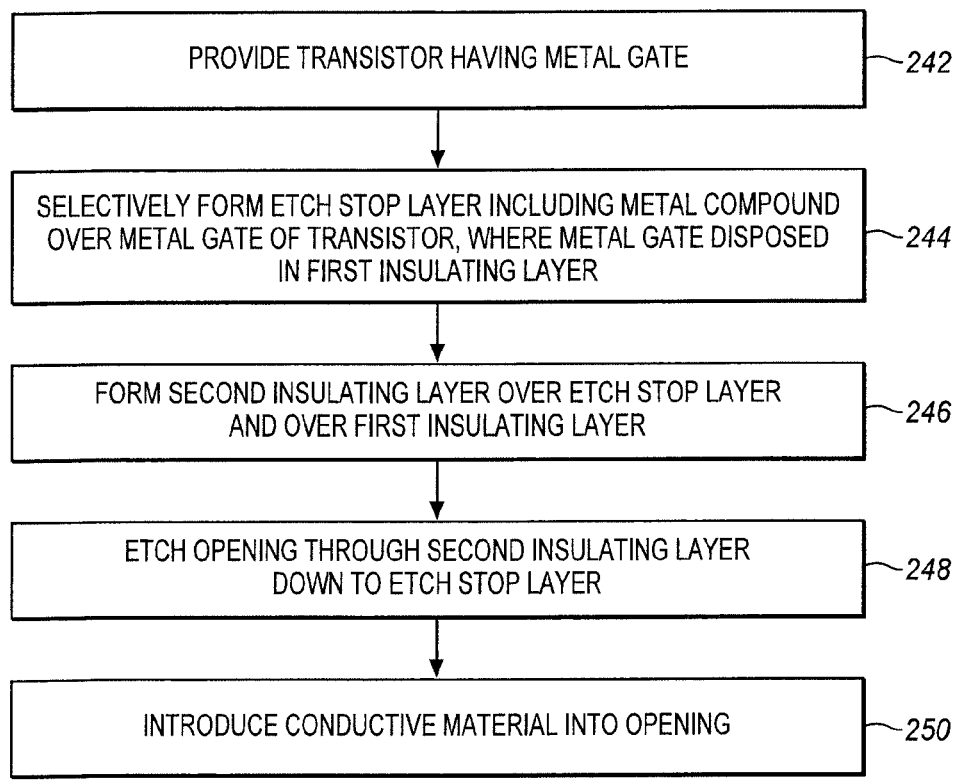
FIG. 2 is a method of forming an electrical contact to a metal gate of a transistor, according to one or more embodiments of the invention.

FIG. 2 is a method 240 of forming an electrical contact to a metal gate of a transistor, according to one or more embodiments of the invention. The method may be used during manufacture of the transistor. FIGS. 3A to 3E are cross-sectional views of various structures that are used as starting structures for or that result from the operations of the method 200, according to various embodiments of the invention. To facilitate description, the method 200 of FIG. 2 will be described in association with the structures shown in FIGS. 3A to 3E.

Referring to FIG. 2, a transistor having a metal gate may be provided, at block 242. In one or more embodiments of the invention, providing the transistor may include manufacturing the transistor. As another option, in one or more embodiments of the invention, providing the transistor may include purchasing, or otherwise acquiring, an already formed transistor suitable for performing the method of FIG. 2.

Figure 3A:
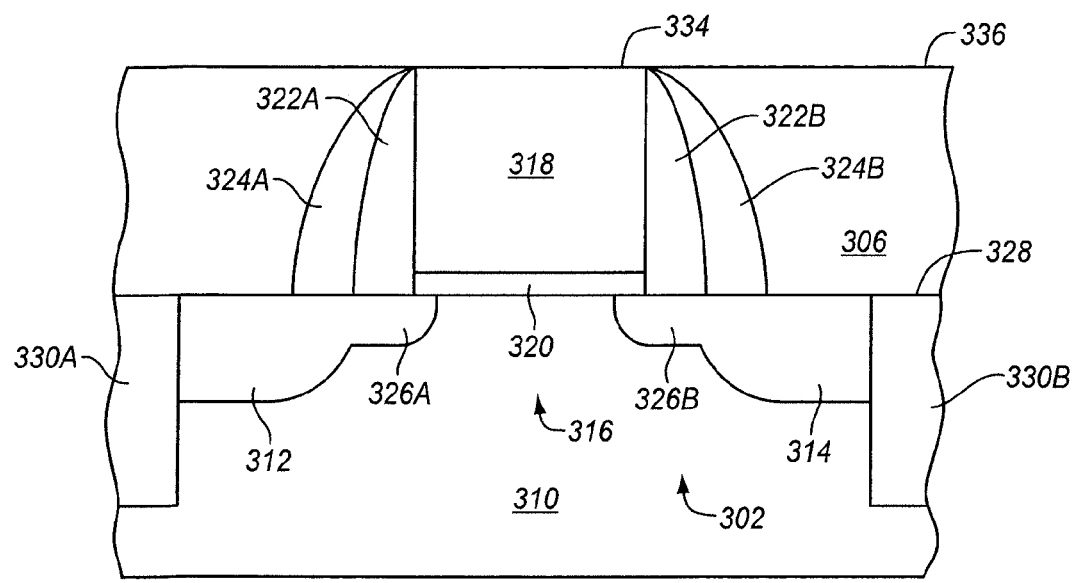
FIGS. 3A-E are cross-sectional views of various structures that are used as starting structures for, or that result from the operations of, the method of FIG. 2, according to various embodiments of the invention.

Turning to FIG. 3A, a portion of a microelectronic device having one example of a suitable transistor 302 having a metal gate 318 is shown, in accordance with one or more embodiments of the invention. It is to be appreciated that this is just one illustrative example of a suitable transistor, and that the scope of the invention is certainly not limited to this particular transistor. Numerous alternate transistor designs known in the art are also suitable.

The microelectronic device includes a substrate 310. The substrate represents a general workpiece object having the transistor formed therein/thereon often as part of an integrated circuit. The substrate may include a semiconductor substrate including a semiconductor material. One suitable semiconductor material is silicon. The use of silicon may allow taking advantage of the large amount of know-how and cost effectiveness of fabricating transistors from silicon, although this is not a requirement of the invention. Suitable substrates including silicon include among others single crystal silicon substrates and silicon on insulator (SOI) substrates. Alternatively, the silicon may potentially be replaced with other well-known elemental or compound semiconductors, such as, for example, germanium (Ge), a combination of elements from Group 4A (e.g., silicon germanium (SiGe) or silicon carbide (SiC)), a combination of elements from Groups 3A and 5A (e.g., gallium arsenide (GaAs), indium phosphide (InP), or gallium nitride (GaN)), or other well-known semiconductors. The substrate may also include other materials, such as, for example, metals, other conductors, dielectrics or insulators, organic materials, and combinations thereof. In addition to the transistor, other passive and/or active devices may potentially be fabricated in and/or on the substrate, including, but not limited to, other transistors, switches, capacitors, resistors, and the like.

The transistor is formed in and/or on the substrate. The transistor includes a source region 312 of the substrate and a drain region 314 of the substrate. The source and drain regions respectively include an optional source tip or extension region 326A and an optional drain tip or extension region 326B. A channel region 316 of the substrate is defined between the source and drain tip or extension regions. A gate dielectric 320 overlies the channel region. The transistor also includes the metal gate 318 over the gate dielectric. The transistor also includes optional first 322A and second 322B sidewall spacers, and optional first 324A and second 324B sidewall etch stops. First 330A and second 330B field isolation regions of the substrate may help to electrically isolate or at least insulate the transistor. In one aspect, the first and second field isolation regions may include shallow trench isolation (STI).

All of these components of the transistor may optionally be conventional, such as, for example, including conventional materials, of conventional sizes and shapes, and formed in conventional ways. Numerous different examples of transistors similar to the one shown are known in the arts and described in the literature. Accordingly, to avoid obscuring the description, a detailed discussion of these components and how they are formed will not be provided. However, a brief discussion of some of the possible variations is warranted.

The source and the drain regions and the tip or extension regions may include doped regions. For n-MOS transistor embodiments, the dopants may include n-type dopants, such as, for example, arsenic (As) ions and/or phosphorous (P) ions. For p-MOS transistor embodiments, the dopants may include p-type dopants, such as, for example, boron (B) ions. By way of example, in one or more embodiments, the concentration of dopant in these regions may range from about $10^{18}$ cm-3 to $10^{21}$ cm-3.

The gate dielectric may include an insulating or dielectric material. Examples of suitable materials include, but are not limited to, oxides of silicon, such as, for example, silicon dioxide (SiO2), nitrides of silicon, such as, for example, silicon nitride (Si3N4), oxynitrides of silicon, such as, for example, silicon oxynitride (SiOxNy), and combinations thereof. As another option, the gate dielectric may include a high dielectric constant (high-k) material. A high-k material is a material that has a dielectric constant (k), which is higher than that of silicon dioxide (SiO2). Examples of suitable high-k materials include, but are not limited to, oxides of zirconium, such as, for example, zirconium dioxide (ZrO2), oxides of hafnium, such as, for example, hafnium dioxide (HFO2), oxides of lanthanum, such as, for example, lanthanum oxide (La2O4), oxides of tantalum, such as, for example, tantalum oxide (Ta2O5), oxides of titanium, such as, for example, titanium dioxide (TiO2), and combinations thereof. The thickness of the gate dielectric may be scaled depending on the dielectric constant of the material used. In one or more embodiments, the thickness of the gate dielectric is in the range of about 5 Å to 100 Å.

The metal gate includes a metal. Examples of suitable metals according to one or more embodiments include, but are not limited to, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Au), platinum (Pt), and combinations thereof. In one or more embodiments, the metal gate may include a noble metal, such as, for example, gold, silver, tantalum, platinum, rhodium, or a combination thereof. The metal gate may also include other materials besides just metals. In one or more embodiments, the metal gate may include a composite metal gate that includes a metal and one or more other sufficiently conductive non-metals. Examples of suitable sufficiently conductive non-metals may include, but are not limited to, conductive semiconductors, such as, for example, polysilicon and polysilicon germanium, various conductive metal compounds, such as, for example, metal nitrides and certain metal oxides, and combinations thereof. In one example embodiment of the invention, the composite metal gate may include a top metal layer overlying one or more other metal or sufficiently conductive non-metal layers. In another example embodiment of the invention, the composite metal gate may be encapsulated on the top and two sides by one or more work function materials, such as, for example, compounds of metals with sufficient conductivities. In one or more embodiments, the thickness of metal gate may range from about 5 nm to 300 nm.

The sidewall spacers, which are optional, may include an oxide material, such as, for example, an oxide of silicon, a nitride material, such as, for example, a nitride of silicon, an oxynitride material, such as, for example, an oxynitride of silicon, a carbide material, such as, for example, a carbide of silicon, or combinations thereof (e.g., an oxy-carbide of silicon and/or a carbide-nitride of silicon). The sidewall etch stops, which are optional, may include a nitride material, such as, for example, a nitride of silicon. Such sidewall etch stops are occasionally known in the art as nitride etch stop layers (NESL). The NESL may help to protect portions of the transistor during a trench contact (TCN) etch.

The microelectronic device also includes a first insulating or dielectric layer 306. The first insulating layer is formed over substantially the entire exposed upper surface 328 of the substrate. The metal gate and its associated sidewall structures are disposed within the first insulating layer. A top surface 336 of the first insulating layer is substantially coplanar with a top surface 334 of the metal gate. The first insulating layer is sometimes referred to as an interlayer dielectric (ILD).

In one or more embodiments of the invention, the first insulating layer may include an oxide of silicon, such as, for example, silicon dioxide (SiO2). As another option, in one or more embodiments, the first insulating layer may include a low dielectric constant (low-k) material having a dielectric constant (k) which is lower than that of silicon dioxide (SiO2). Examples of suitable low-k materials include, but are not limited to, fluorine containing dielectric materials, such as, for example, fluorinated oxide of silicon (e.g., SiOF), fluorine-doped silicate glass (FSG), other fluorine doped glasses, and combinations thereof. Other examples of suitable low-k materials include, but are not limited to, inorganic porous oxide-like low-k dielectric materials, other porous materials, carbon doped oxide of silicon, and other carbon-doped oxides (CDOs). Still other materials that may potentially be used, depending upon the particular implementation (e.g., the temperatures encountered during subsequent processing), include, but are not limited to, WPR-series materials, hybrid organic-inorganic low-k dielectrics, polyimide, epoxy, benzocyclobutene (BCB)-based photosensitive polymer dielectrics, and combinations thereof. The combinations may include stacks or mixtures.

Insulating layers including these various materials may be formed over the substrate using known techniques. Examples of techniques each useful for one or more of these materials include, but are not limited to, spin-on deposition, plasma CVD, high-density plasma (HDP) CVD, diffusion furnace CVD, other forms of CVD, sputtering, other forms of physical vapor deposition (PVD), ALD, and other deposition approaches known in the arts. In one or more embodiments, first insulating layer may be deposited to a thickness greater than a height of the gate electrode. In one embodiment, first insulating layer may be deposited to a thickness in the approximate range of 50 nm to 500 nm, although the scope of the invention is not limited to any known thickness. The deposited insulating layer may cover the top surface of the metal gate, such as, for example, by at least several nanometers. Then, a top portion of the deposited insulating layer may be removed, such as, for example, by chemical-mechanical polishing (CMP) or other polishing, or by wet etching, dry etching, or other etching, or by a combination of such approaches.

As previously discussed, this is just one illustrative example of a suitable transistor. The scope of the invention is certainly not limited to this particular transistor. Numerous alternate transistor designs known in the art are also suitable. For example, asymmetric transistors with differently sized and/or shaped source and drain regions are suitable. As another example, transistors that omit the sidewall spacers are suitable. As yet another example, transistors that omit the sidewall etch stops are suitable. As a further example, transistors that omit the tips or extension regions are suitable. Other transistors of different sizes, shapes, and configurations or layouts are also suitable.

Referring again to FIG. 2, after providing the transistor, such as, for example, the transistor shown in FIG. 3A, an etch stop layer including a metal compound may be selectively formed over the metal gate of the transistor, at block 244. In one or more embodiments of the invention, selectively forming the etch stop layer including the metal compound over the metal gate of the transistor may include forming the metal compound by reactively converting a metal of a top surface of the metal gate.

As previously discussed, in one or more embodiments of the invention, a native metal of the top surface of the metal gate may be reactively converted to form the metal compound. This approach will be shown and described further below in conjunction with FIG. 3B. As another option, in one or more embodiments of the invention, a metal layer cap may be selectively deposited over the native metal of the top surface of the metal gate, and then the etch stop layer may be formed over the metal gate by reactively converting at least a portion of the deposited metal layer cap to a metal compound. This approach will be shown and described further below in conjunction with FIGS. 4 and 5A-B. Initially, the first approach will be discussed, and then the latter approach will be discussed further below.

Forming the metal compound by reactively converting the metal of the top surface of the metal gate may include oxidizing, reacting, or combining the metal with oxygen or an oxygen containing compound to form an oxide of the metal, reacting or combining the metal with nitrogen or a nitrogen containing compound to form an nitride of the metal, reacting or combining the metal with carbon or a carbon containing compound to form an carbide of the metal, reacting or combining the metal with boron or a boron containing compound to form an boride of the metal, or a combination thereof. One example approach for oxidizing the metal, according to one or more embodiments of the invention, may include thermally annealing the metal in the presence of oxygen (O2), water (H2O), or another suitable oxygen containing compound. As one particular example, aluminum may be oxidized by exposing the aluminum to water vapor at about 10 Torr and a temperature of about 400° C.

Another example approach for oxidizing the metal, according to one or more embodiments of the invention, may include treating the metal with a plasma including oxygen, nitrous oxide (N2O), carbon dioxide (CO2) or another suitable oxygen containing compound. In one particular example, titanium, iron, or aluminum may be oxidized by exposure to about 3 Torr of nitrous oxide in a radiofrequency plasma of about 200 W applied power at a temperature of about 300° C. In another example, a metal may be oxidized by treatment with an nitrous oxide (N2O), carbon dioxide (CO2) or oxygen plasma for from 5 to 20 minutes at a temperature of 350 to 450 C. The use of a plasma may tend to be faster than the thermal oxidation described immediately above and may tend to be less detrimental to the diffusion of underlying gates metal.

One example approach for forming the nitride of the metal, according to one or more embodiments of the invention, may include treating the metal with a plasma including ammonia (NH3), nitrogen (N2), or another suitable nitrogen containing compound. In one particular example, a nitride of aluminum or other metals may be formed by exposing the aluminum to about 2.8 Torr of ammonia in a radiofrequency plasma of about 150 W applied power at a temperature of about 350 to 400 C for about 5 to 15 minutes.

One example approach for forming the carbide of the metal, according to one or more embodiments of the invention, may include treating the metal with a plasma including carbon dioxide (CO2), methane (CH4), ethylene (C2H4), or another suitable carbon containing compound. In one particular example, a carbide of germanium, aluminum or titanium may be formed by exposing the germanium, aluminum, or titanium, to about Torr ethylene in a radiofrequency plasma of about 300 W applied power at a temperature of about 350 C.

A top surface portion of the native metal of the metal gate may be consumed or converted to metal compound by these reactive processes. In one or more embodiments of the invention, the native metal of the gate may be capable of forming a passivating oxide, a passivating nitride, a passivating carbide, or a combination thereof. Many metals are capable of forming such passivating layers. Examples of metals that are capable of forming passivating oxides include, but are not limited to, aluminum (Al), chromium (Cr), molybdenum (Mo), and nickel (Ni), although the scope of the invention is not limited to just these metals. The thickness of the passivating layer may be modified for a given metal by changing the reaction conditions. In such embodiments, the reactive conversion of the metal may be stopped automatically at a given thickness of the etch stop layer due to the passivation or self-limiting nature of the reaction. Alternatively, a metal that doesn't form such a passivating layer may optionally be used and the reactive conversion may be stopped when a desired thickness of the etch stop layer is achieved. The use of a metal that forms a passivating layer may be favored to promote device reliability, stability, and/or across-wafer uniformity in the etch stop layer thickness. In various embodiments of the invention, the thickness of the etch stop layer may range from 5 nm to 100 nm, or from 5 nm to 50 nm, or from 10 nm to 50 nm, or from 10 nm to 30 nm. Although the scope of the invention is not limited to any know thickness.

The top surface of the first insulating layer may be exposed to the treatment used to form the etch stop layer. Oxidation generally will not significantly adversely affect a silicon dioxide (SiO2) or similar oxide-based dielectric material of the first insulating layer. Certain other materials that are suitable for the first insulating layer may potentially be affected or changed slightly by the treatment. Likewise, formation of nitride and carbide-based etch stop layers may potentially affect silicon dioxide and certain other dielectric material of the first insulating layer. Potential efforts that may be used to reduce the affects of the treatment may include localized treatment, short treatment, and selecting a treatment that is relatively compatible with the dielectric material. In certain implementations, any remaining changes to the dielectric material that may potentially result from the treatment may be tolerable. As yet another option, a patterned sacrificial photoresist layer or other layer or screen may optionally be used to help shield the first insulating layer from the treatment, and then later be removed.

Figure 3B:
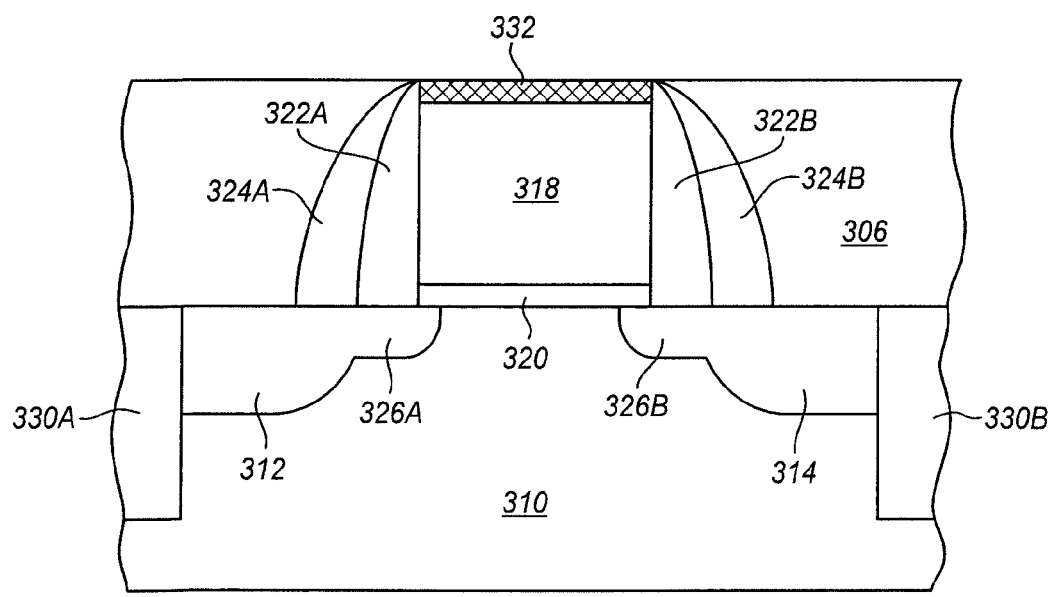

Refer now to FIG. 3B. FIG. 3B shows an etch stop layer 332 including a metal compound selectively formed over the metal gate of the transistor of FIG. 3A, according to one or more embodiments of the invention. The metal compound may be formed as previously described by reactively converting a native metal at the top of the metal gate of the transistor shown in FIG. 3A. As a result, the metal of the metal compound may be the same as the metal of the top surface of the metal gate immediately below the etch stop layer. Examples of suitable compounds include, but are not limited to, oxides of the metal, nitrides of the metal, carbides of the metal, and combinations thereof.

Notice that the etch stop layer is directly on the native metal of the metal gate. The etch stop layer has a bottom surface that extends below the top surface of the sidewall spacer a thickness of the etch stop layer. In the illustration, the top surface is substantially aligned with a top surface of a sidewall spacer of the metal gate and/or the top surface of the first insulating layer. This may be the case if there is increase or decrease in volume due to the reactive conversion. Alternatively, if there is an increase in volume, the top surface of the etch stop layer may be slightly above these other surfaces. Similarly, if there is a decrease in volume, the top surface of the etch stop layer may be slightly below these other surfaces. As shown in the illustrated embodiment, the etch stop layer may be disposed between the first and second sidewall spacers. In some cases, a slight amount of lateral encroachment onto the sidewalls spacers may be observed. However, the etch stop layer is not formed to any substantial extent over the top surface of the first insulating layer.

The metal of the metal compound of the etch stop layer may be any metals suitable for the metal gate which are capable of forming metal compounds as disclosed herein under temperature conditions compatible with the transistor. Examples of suitable metals according to one or more embodiments include, but are not limited to, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), silver (Au), and combinations thereof. In one or more embodiments of the invention, the metal may be capable of forming a passivating layer. In one or more embodiments of the invention, the metal may include aluminum, chromium, molybdenum, nickel, titanium, tungsten, tantalum, or an alloy or other combination thereof.

Referring back to FIG. 2, after forming the etch stop layer, a second insulating layer may be formed over the etch stop layer and over the first insulating layer, at block 246. The second insulating layer is sometimes referred to as an interlayer dielectric (ILD) cap or contact cap oxide.

In one or more embodiments of the invention, the second insulating layer may include an oxide of silicon, such as, for example, silicon dioxide (SiO2). As another option, in one or more embodiments, the second insulating layer may include a low dielectric constant (low-k) material having a dielectric constant (k) which is lower than that of silicon dioxide (SiO2). Examples of suitable low-k materials include, but are not limited to, fluorine containing dielectric materials of the types mentioned before for the first dielectric layer. Other examples of suitable low-k materials include, but are not limited to, inorganic porous oxide-like low-k dielectric materials, other porous materials, carbon doped oxide of silicon, and other carbon-doped oxides (CDOs). Still other materials that may potentially be used, depending upon the particular implementation (e.g., the temperatures encountered during subsequent processing), include, but are not limited to, WPR-series materials, hybrid organic-inorganic low-k dielectrics, polyimide, epoxy, benzocyclobutene (BCB)-based photosensitive polymer dielectrics, and combinations thereof. The combinations may include stacks or mixtures.

The second insulating layer of these various materials may be formed over the substrate using known techniques. Examples of techniques each useful for one or more of these materials include, but are not limited to, spin-on deposition, plasma enhanced-chemical vapor deposition (PE-CVD), high-density plasma (HDP) CVD, diffusion furnace CVD, remote plasma CVD, other forms of CVD, ALD, plasma-enhanced ALD, sputtering, other forms of PVD, and other deposition approaches known in the arts.

In one embodiment, the second insulating layer may be deposited to a thickness in the approximate range of 15 nm to 500 nm, although the scope of the invention is not limited to any known thickness. If desired, a top portion of the deposited second insulating layer may optionally be removed or planarized, such as, for example, by chemical-mechanical polishing (CMP) or other polishing, or by wet etching, dry etching, or other etching, or by a combination of such approaches, although this is not required.

Figure 3C:
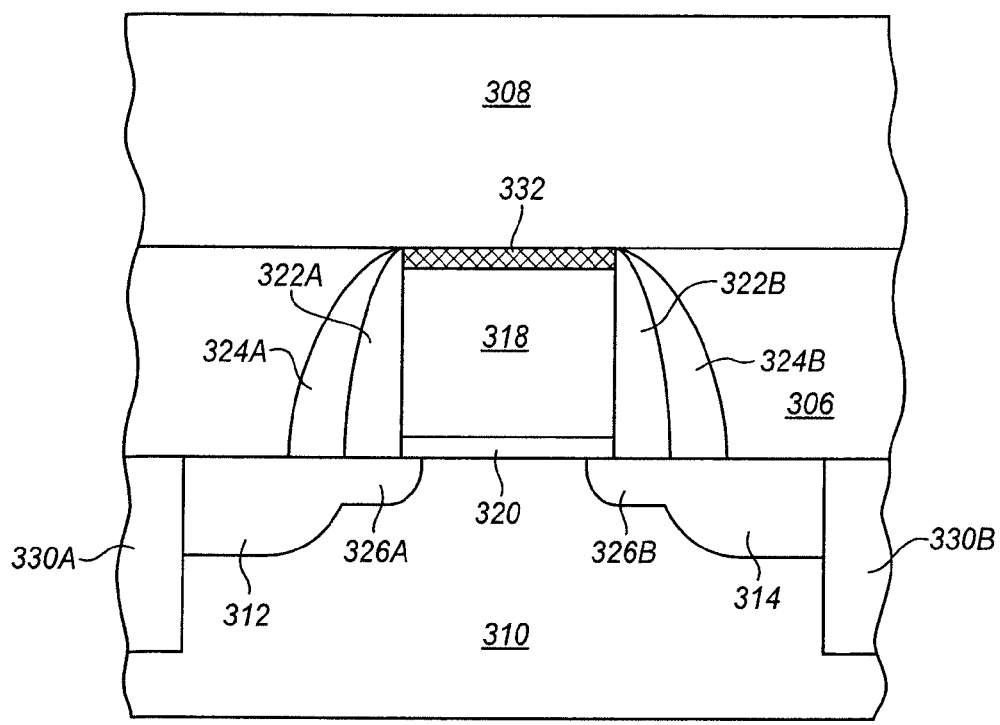

Refer briefly to FIG. 3C. FIG. 3C shows a second insulating layer 308 formed over the metal gate 318 and first insulating layer 306 of the intermediate structure of FIG. 3B, according to one or more embodiments of the invention. As shown, the second insulating layer may be formed substantially over the entire upper exposed surfaces of the etch stop layer and the first insulating layer.

Referring back to FIG. 2, after forming the second insulating layer, openings through the second insulating layer may be etched down to the etch stop layer, at block 248. The openings may be used to provide contacts to the source and drain regions and metal gate of the transistor. Either the same etch may be used to form openings for the source and drain regions and the metal gate, or else two or more different etches may optionally be used.

In one or more embodiments of the invention, the openings may be formed by depositing and patterning a photoresist layer with gaps or openings corresponding to the openings to be etched. Then, an etchant may be used to remove portions of the second insulating layer to form the openings. Various known hydrocarbon-based or halogen-based etching chemistries are suitable.

Figure 3D:
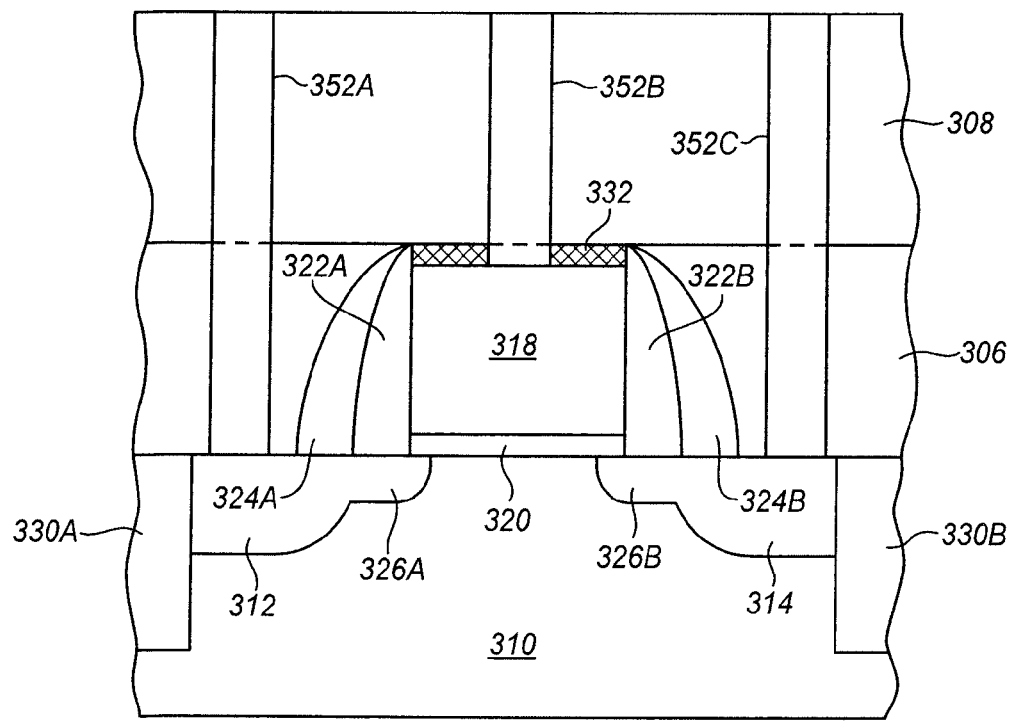

Refer now to FIG. 3D. FIG. 3D shows openings formed by etching the first and/or second insulating layers of the intermediate structure of FIG. 3C, according to one or more embodiments of the invention.

In particular, three openings are formed. A first opening 352A is formed through the first and second insulating layers down to the top surface of the substrate over the source region of the transistor. Likewise, a second opening 352C is formed through the first and second insulating layers down to the top surface of the substrate over the drain region. A third opening 352B is formed through the second insulating layer and through, or at least through a substantial portion of, the etch stop layer over the metal gate. The substantial portion will generally include much or most of the thickness of the etch stop layer if the etch stop layer is highly dielectric, alternatively it may be less if the etch stop layer is more conducting.

The scope of the invention is not limited to any known size or shape of the opening. However, in one or more embodiments, the diameter of each of the three openings may be in the range of about 0.2 um to 30 um (often in the range of about 0.2 um to 10 um). In one or more embodiments, the diameter of each of the three openings may be based on the aspect ratio of the openings, and may, for example, be in the range of about 1:10 to 1:100. In one or more embodiments, the openings may have a tapered shape, with the top of the openings being wider than the bottom. However, the scope of the invention is not limited to these particular sizes or shapes.

Referring again to FIG. 2, a conductive material may be introduced into the openings, at block 250. In one or more embodiments of the invention, the conductive material may include multiple different materials, such as, for example, one or more barrier materials or layers, and a core or plug material. Examples of suitable materials for the barrier layers include, but are not limited to, molybdenum, nickel, cobalt, titanium, tungsten, tantalum, aluminum, rhenium, ruthenium, and combinations thereof. Other examples of suitable materials for the barrier layer include, but are not limited to, cobalt-nickel compound, titanium-tungsten compound, tantalum-nitride compound, tantalum-silicon-nitride compound, titanium-nitride compound, titanium-tantalum-nitride titanium-silicon-nitride compound, tungsten-nitride compound, tungsten-silicon-nitride compound, and combinations of such materials. The combinations may include mixtures, stacks, or other combinations. Other barrier materials known in the arts may also optionally be used. Examples of suitable core or plug materials include, but are not limited to, copper, copper materials or alloys, aluminum, aluminum materials or alloys, gold, platinum, other highly conductive metals, and combinations thereof. Other metals may also optionally be used. As yet another option, a core or plug material may be used without a barrier or liner layer. These various materials may be deposited using known techniques, such as, for example, CVD, ALD, PVD, and plating, such as, for example, electroplating or electroless plating. The aforementioned single materials are also suitable for the core. In one or more embodiments, a damascene-based process may be used.

Figure 3E:
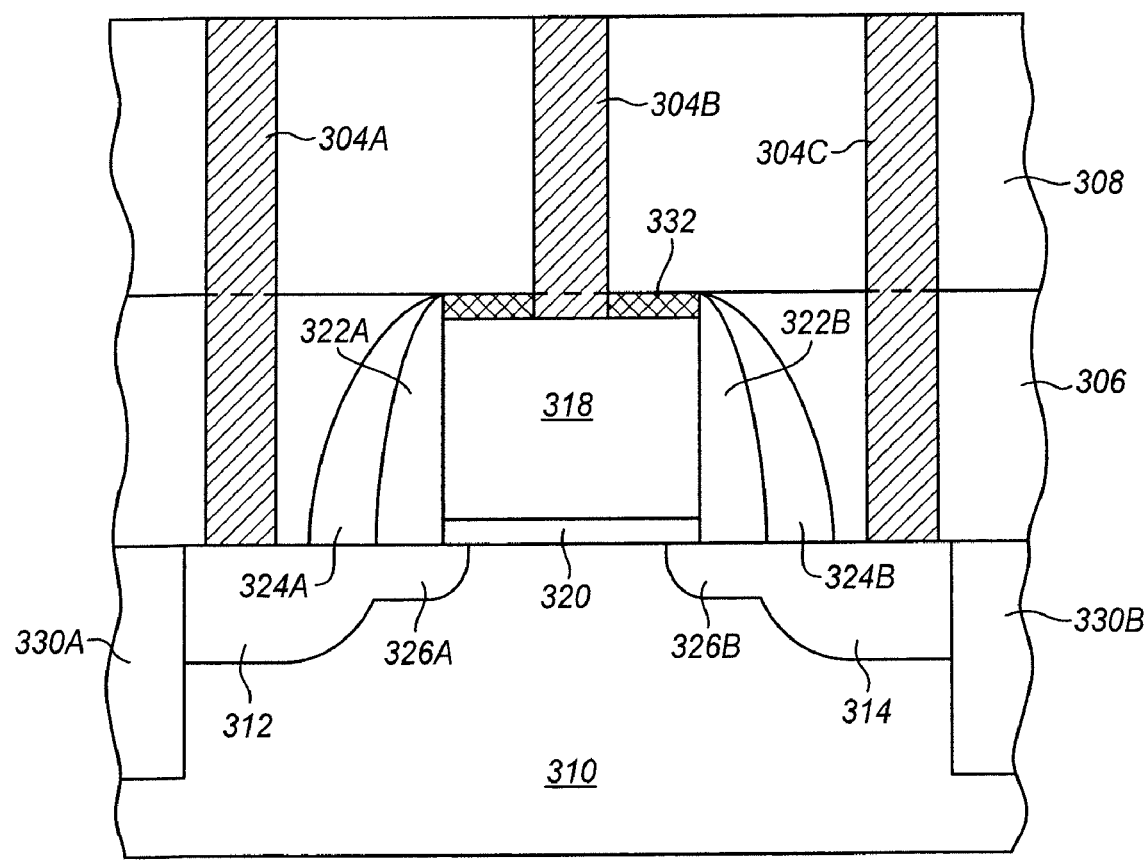

Refer now to FIG. 3E. FIG. 3E shows conductive structures through the insulating layer or layers formed by introducing conductive material into the openings of the intermediate structure of FIG. 3D, according to one or more embodiments of the invention. A first conductive electrical contact structure 304A is formed through the first and second insulating layers to provide electrical connection to the source region of the transistor. Likewise, a second conductive electrical contact structure 304C is formed through the first and second insulating layers to provide electrical connection to the drain region of the transistor. A third conductive electrical contact structure 304B is formed through the second insulating layer to provide electrical connection to the metal gate of the transistor. These structures are sometimes referred to in the arts as contacts, vias, interconnects, lines, metallization, or simply metal. They may represent conductive paths or materials or signaling paths or materials.

As previously mentioned, it is not required to convert or consume the native metal of the metal gate to form the etch stop layer. As another option, in one or more embodiments of the invention, a metal layer cap may be selectively deposited over the native metal of the top surface of the metal gate, and then the etch stop layer may be formed over the metal gate by reactively converting at least a portion of the deposited metal layer cap to a metal compound.

Figure 5A:
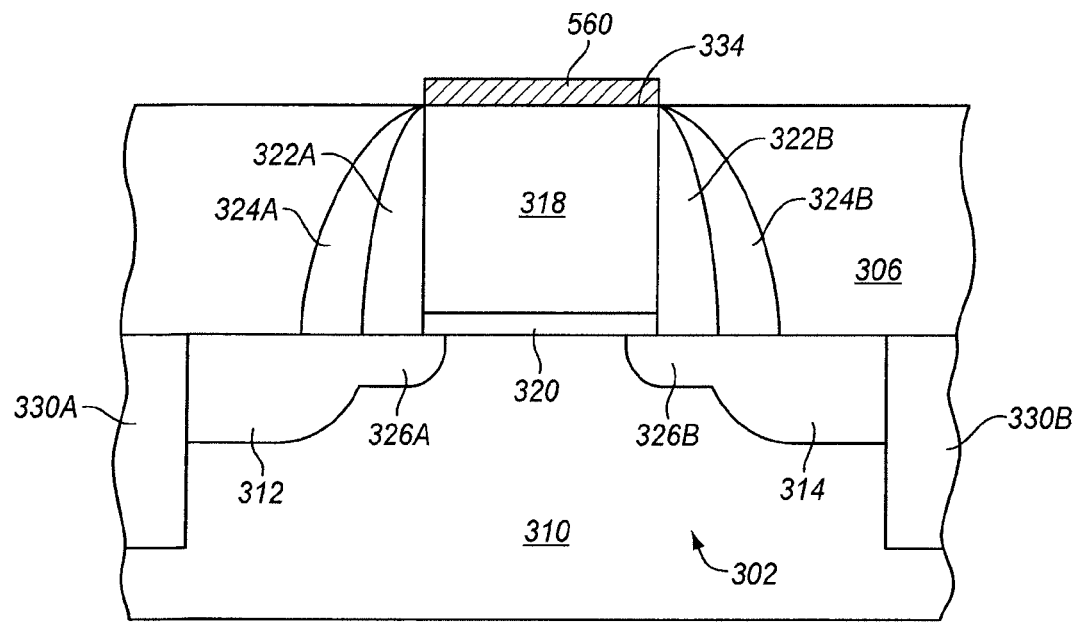
FIGS. 5A-B are cross-sectional views of intermediate structures that result from the operations of the method of FIG. 4, according to various embodiments of the invention FIG. 6 conceptually shows a misaligned source or drain contact stopping at an etch stop as disclosed elsewhere herein and a gate contact going through the etch stop to land on a metal gate, according to one or more embodiments of the invention.
Figure 5B:
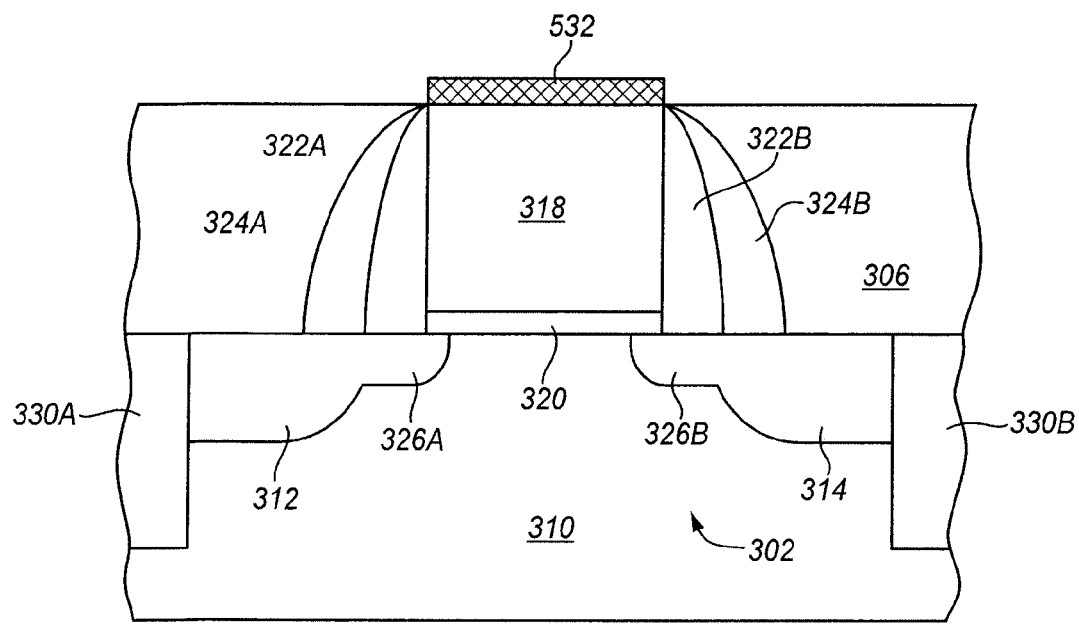

FIG. 4 is a method 454 of selectively forming an etch stop layer over a metal gate of a transistor, according to one or more embodiments of the invention. FIGS. 5A to 5B are cross-sectional views of intermediate structures that result from the operations of the method 454, according to various embodiments of the invention.

Referring first to FIG. 4, a metal layer may be selectively deposited over a native metal of a top surface of a metal gate of a transistor, at block 456. FIG. 5A shows that a metal layer 560 may be selectively formed over a metal gate 318 of a structure such as that shown in FIG. 3A. In the illustrated embodiment, the metal layer is directly on the native metal of the top surface of the metal gate. Alternatively, one or more other materials or layers, such as, for example, a barrier material, may optionally be disposed between the two. As shown, the metal layer may have a bottom surface that is substantially aligned with a top surface of a sidewall spacer of the metal gate and top surface of the first insulating layer, and a top surface that extends above the top surface of the sidewall spacer and above the top surface of the first insulating layer. In various embodiments of the invention, the thickness of the metal layer may range from about 5 nm to 50 nm, or from about 5 nm to 30 nm, or about 10 nm to 30 nm. However, the scope of the invention is not limited to any known thickness.

In one or more embodiments of the invention, the metal may be different than a native metal of the metal gate on which the metal is deposited directly on. Advantageously, the deposition of a metal cap of a different metal may allow the metal of the etch stop layer and the metal of the metal gate to be selected relatively independently of one another in order to meet each of the metals respective design objectives. For example, the metal of the metal cap may be selected based on its ability to form a metal compound under particular conditions, its ability to form a passivating layer, or for other reasons, without changing the metal of the metal gate. Furthermore, there is no requirement that the metal of the metal gate be either capable of forming a metal compound under the formation conditions or be capable of forming a passivating layer (e.g., some may form thicker oxide layers than desired).

Examples of suitable metals according to one or more embodiments include, but are not limited to, copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), vanadium (V), molybdenum (Mo), palladium (Pd), gold (Au), silver (Au), platinum (Pt), and combinations thereof. In one or more embodiments of the invention, the metal may include aluminum (Al), chromium (Cr), molybdenum (Mo), and nickel (Ni), although the scope of the invention is not limited to just these metals. In one or more embodiments of the invention, the metal may be capable of forming a passivating oxide, a passivating nitride, a passivating carbide, or a combination thereof.

Examples of approaches that may be used to selectively deposit the metal over the metal gate include, but are not limited to, electroless deposition, ALD, and CVD. Methods of using these techniques for selective deposition are known in the arts. By way of example, see the article "Selective Metallization by Chemical Vapor Deposition", by Wayne Gladfelter, in Chem. Mater. 1993, 5, 1372-1388.

In one or more embodiments of the invention, prior to depositing the metal cap layer, the top surface of the metal gate may optionally be pre-treated to improve deposition, although this is not required. By way of example, in one or more embodiments of the invention, the metal of the metal gate may be exposed to hydrogen, such as, for example, in the form of a plasma including hydrogen. The hydrogen may help to reduce or otherwise remove or reduce oxide and/or organic contaminants from the top surface of the metal gate. If the first insulating layer includes silicon dioxide (SiO2), the hydrogen may also help to convert silanol groups (Si—OH) to siloxane (Si—O—Si) bridge bonds. Heating, annealing, or rapid annealing may then be used to desorb the hydrogen. In one aspect, the temperature may be less than about 200° C. This pre-treatment may help to create clean active metal sites with dangling bonds which are receptive to selective deposition, and reduce defects and active sites on the silicon dioxide.

Referring again to FIG. 4, the etch stop layer may be formed over the metal gate by reactively converting the metal of the deposited metal cap layer to metal compound, at block 458. The etch stop layer may be formed substantially as described previously, with the exception that the metal cap layer is reactively converted instead of, or at least before, the metal of the metal gate.

Refer now to FIG. 5B. FIG. 5B shows an etch stop layer 532 formed by reactively converting the metal cap layer 560 of the intermediate structure of FIG. 5A, according to one or more embodiments of the invention. In the illustrated embodiment, the whole metal cap layer is converted. As other options, a portion of the metal cap layer may be converted, or the whole metal cap layer plus a portion of the top of the metal gate may be converted. As shown, the etch stop layer may have a bottom surface that is substantially aligned with a top surface of a sidewall spacer of the metal gate, and a top surface that extends above the top surface of the sidewall spacer. The reactive conversion may cause a slight increase or decrease in volume/thickness of the deposited metal cap layer. In the illustrated embodiment, the etch stop layer is directly on the metal gate, although in one or more other embodiments one or more intervening materials or layers, such as, for example, a barrier layer or adhesion layer, may be disposed therebetween.

Figure 6:
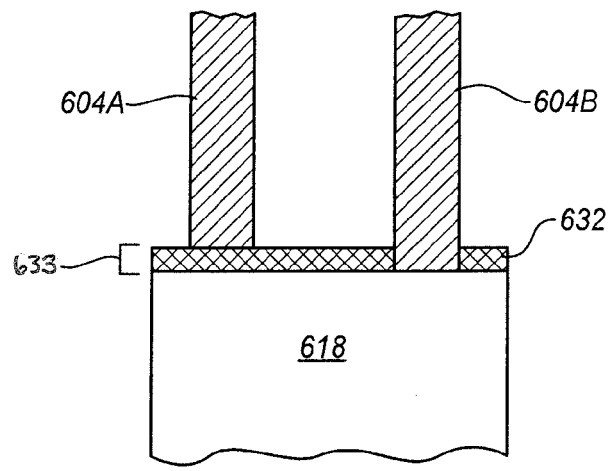

FIG. 6 conceptually shows a misaligned source or drain contact 604A stopping at an etch stop 632 as disclosed elsewhere herein and a gate contact 6048 going through the etch stop to land on a metal gate 618, according to one or more embodiments of the invention.

In one or more embodiments of the invention, the etches for the source and drain contacts and the etch for the gate contact may be performed at different times and have different etch chemistries. The etch stop layer may have different and slower etch rate than the first and second insulating layers. The etches for the source and drain contact may be capable of etching the first and second insulating layers but significantly slower at etching the selective etch stop layer over the gate. Accordingly, it may be easy to stop the source and drain etches on the etch stop layer. In addition, the etch stop layer over the gate may be, in one or more embodiments, dielectric or insulating. As a result, if a misaligned source and/or drain etch occurs over the metal gate, the etch may stop at the etch stop layer with a thickness 633 of the insulating or dielectric etch stop layer material disposed between the conductive material in the contact and the metal gate. This insulating material may help to prevent, or at least reduce, contact-to-gate shorts. It is to be appreciated that in practice the misaligned source/drain contact may land partially on the gate but still extend down to contact the source. The illustration represents a simple, conceptual view to better illustrate certain concepts.

In contrast, the etch for the gate contact may be capable of etching the etch stop layer more rapidly than the etch for the source and drain contacts. Since the gate contact etches need to etch through the etch stop layer, but the source and drain contact etches do not, the gate contact etch may be designed to be much better at etching the etch stop layer. Alternatively, the gate etch may stop on the etch stop layer and an additional gate etch may be used to etch through the etch stop layer. As a result, the etch for the gate contact may etch through the etch stop layer and land on or sufficiently near the metal gate that electrical connection may be achieved.

Accordingly, the etch stop layers disclosed herein, which are selectively on the gate, may help to prevent, or at least reduce, the amount of contact-to-gate shortings. Furthermore, this ability to prevent, or at least reduce, shorting at spacings that are smaller then your registration capabilities, may allow more transistors to be packed into a smaller area and help to increase the number of transistors per die and/or reduce die size. The etch stop layers as disclosed herein may also help to reduce rework during lithography to obtain good alignment/registration, which may help to reduce manufacturing costs.

Figure 7:
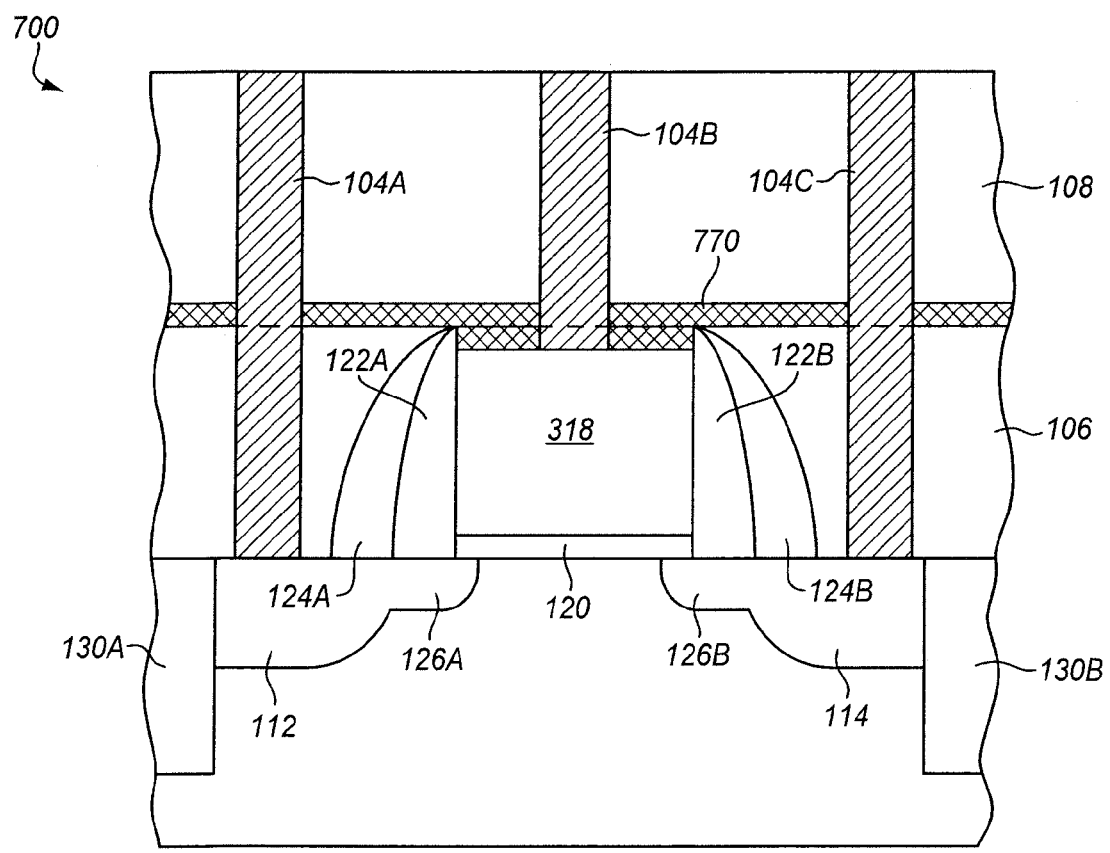
FIG. 7 is a cross-sectional side view of a microelectronic device similar to that shown in FIG. 1 but also including a standard blanket gate etch stop layer (GESL) over a substantial portion of a top surface of the first insulating layer, according to one or more embodiments of the invention.

FIG. 7 is a cross-sectional side view of a microelectronic device 700 similar to that shown in FIG. 1 but also including a standard blanket gate etch stop layer (GESL) 770 over a substantial portion of a top surface of the first insulating layer, according to one or more embodiments of the invention. In various embodiments, the GELS may include silicon nitride, silicon carbide, silicon oxide-carbide, or a combination thereof. A similar microelectronic device is also contemplated for the etch stop layer shown in FIG. 5B. The GESL may serve as an etch stop for the source and the drain contacts. Alternatively, the blanket deposited GESL may be omitted.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. Similarly, the term "over" may mean, but does not necessarily mean, "on". There may be one or more intervening materials, layers, or other structures.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description.

It will also be appreciated, by one skilled in the art, that modifications may be made to the embodiments disclosed herein, such as, for example, to the sizes, shapes, configurations, forms, functions, materials, and manner of operation, and assembly and use, of the components of the embodiments. All equivalent relationships to those illustrated in the drawings and described in the specification are encompassed within embodiments of the invention.

For simplicity and clarity of illustration, elements illustrated in the figures have not necessarily been drawn to scale. For example, the dimensions of some of the elements are exaggerated relative to other elements for clarity. Further, where considered appropriate, reference numerals or terminal portions of reference numerals have been repeated among the figures to indicate corresponding or analogous elements, which may optionally have similar characteristics.

Various operations and methods have been described. Some of the methods have been described in a basic form, but operations may optionally be added to and/or removed from the methods. The operations of the methods may also often optionally be performed in different order. Many modifications and adaptations may be made to the methods and are contemplated.

For clarity, in the claims, any element that does not explicitly state "means for" performing a specified function, or "step for" performing a specified function, is not to be interpreted as a "means" or "step" clause as specified in 35 U.S.C. Section 112, Paragraph 6. In particular, any potential use of "step of" in the claims herein is not intended to invoke the provisions of 35 U.S.C. Section 112, Paragraph 6.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

Accordingly, while the invention has been thoroughly described in terms of several embodiments, those skilled in the art will recognize that the invention is not limited to the particular embodiments described, but may be practiced with modification and alteration within the spirit and scope of the appended claims. The description is thus to be regarded as illustrative instead of limiting.

What is claimed is:

1. A method comprising:
    selectively forming an etch stop layer including a metal compound over a metal gate of a transistor, wherein the selectively forming occurs while the metal gate is disposed in a first insulating layer;
    forming a second insulating layer over the etch stop layer and over the first insulating layer;
    etching an opening through the second insulating layer down to the etch stop layer; and
    introducing a conductive material into the opening,
    wherein said selectively forming the etch stop layer including the metal compound comprises forming the metal compound by reactively converting a metal of the metal gate.

2. The method of claim 1, wherein the metal compound comprises at least one selected from aluminum, chromium, molybdenum, nickel, titanium, tungsten, tantalum, and combinations thereof.

3. The method of claim 1, wherein said reactively converting the metal comprises one or more of forming an oxide of the metal, forming a nitride of the metal, and forming a carbide of the metal.

4. The method of claim 3, wherein said forming the oxide of the metal comprises one or more of treating the metal with a plasma including a first oxygen containing compound and thermally annealing the metal in the presence of a second oxygen containing compound, wherein said forming the nitride of the metal comprises treating the metal with a plasma including a nitrogen containing compound, and wherein said forming the carbide of the metal comprises treating the metal with a plasma including a carbon containing compound.

5. The method of claim 1, further comprising stopping the reactively converting the metal at a given thickness of the etch stop layer due to the reactively converting being self-limiting.

6. The method of claim 1, further comprising, prior to said reactively converting the metal, selectively depositing the metal that is subsequently reactively converted on a second metal of a top surface of the metal gate, wherein the second metal is different than the metal that is deposited and subsequently reactively converted.

7. The method of claim 6, further comprising prior to depositing the metal, pretreating the top surface of the metal gate and a top surface of the first insulating layer by exposing the surfaces to a hydrogen plasma and then heating the surfaces to desorb hydrogen.

8. The method of claim 1, wherein the etch stop layer is not formed over a portion of a top surface of the first insulating layer that is more than 30 nm from an edge of the metal gate.

9. A method comprising:

selectively forming an etch stop layer including a metal compound over a metal gate of a transistor, wherein the selectively forming occurs while the metal gate is disposed in a first insulating layer;

forming a second insulating layer over the etch stop layer and over the first insulating layer;

etching an opening through the second insulating layer down to the etch stop layer; and introducing a conductive material into the opening, wherein the etch stop layer has a thickness ranging from 5 nanometers to 30 nanometers, and wherein said selectively forming the etch stop layer including the metal compound comprises forming the metal compound by reactively converting a metal of the metal gate, the metal of the metal gate that is reactively converted being selected from aluminum, chromium, molybdenum, nickel, tantalum, and a combination thereof.

10. The method of claim 9, further comprising stopping the reactively converting at a given thickness of the etch stop layer due to the reactively converting being self-limiting.

11. The method of claim 9, wherein the metal of the metal gate that is reactively converted being selected from aluminum, chromium, molybdenum, and a combination thereof.

12. The method of claim 9, wherein said reactively converting the metal comprises one or more of forming a carbide of the metal of the metal gate and forming a boride of the metal of the metal gate.

* * * * *